United States Patent [19]

Young

[11] Patent Number: 4,661,214

[45] Date of Patent: Apr. 28, 1987

[54] METHOD AND APPARATUS FOR ELECTRICALLY DISCONNECTING CONDUCTORS

[75] Inventor: Peter L. Young, South Barrington, Ill.

[73] Assignee: Optical Materials, Inc., Mercer Island, Wash.

[21] Appl. No.: 807,676

[22] Filed: Dec. 11, 1985

[51] Int. Cl.⁴ .............................................. C25D 5/02
[52] U.S. Cl. .................................... 204/15; 204/37.1; 204/38.1
[58] Field of Search ..................... 204/37.1, 38.1, 15

[56] References Cited

U.S. PATENT DOCUMENTS 3,801,366  4/1974  Lemelson ............................ 430/296

Primary Examiner—T. M. Tufariello
Attorney, Agent, or Firm—Mason, Kolehmainen, Rathburn & Wyss

[57] ABSTRACT

A method and apparatus for selectively disconnecting two electrical conductors either on the surface or below the surface of a semiconductor chip or a thin film interconnection module connecting several semiconductor chips utilizes a thin metal film such as a silver film that is deposited over the ends of two conductors that it may become necessary to disconnect in the future. An insulating layer, such as a silver halide film, having the capability of absorbing the silver film under irradiation or upon heating is deposited over the silver film. Before irradiation or heating, the silver film provides a low resistance electrical connection between the two conductors. When it is desired to disconnect the two conductors, the insulating layer is irradiated by a focused source such as a laser, thus causing the insulating layer to absorb the metal film, thereby breaking the electrical connection between the conductors. Alternatively, the semiconductor chip or the thin film interconnection module may be heated in an oven to cause the conductors to be disconnected.

63 Claims, 5 Drawing Figures

METHOD AND APPARATUS FOR ELECTRICALLY DISCONNECTING CONDUCTORS

BACKGROUND OF THE INVENTION

1. Field of the Invention

This invention relates generally to semiconductor device fabrication and to thin film interconnection module fabrication, and more particularly to a method and apparatus for selectively disconnecting predetermined areas on these devices, including areas below the surface of the device.

2. Description of the Prior Art

In present semiconductor device fabrication technology, it is often necessary to utilize redundancy in order to improve fabrication yields as device density increases. In such semiconductor chips, redundant devices are fabricated, and if a device or a portion of a chip is nonfunctional, a laser beam is used to cut the conductors on the surface of the semiconductor chip leading to the nonfunctional portion in order to isolate that portion from the properly functioning devices. This technique is called laser ablation and is now commonly used by semiconductor chip manufacturers when manufacturing large scale devices, such as, for example, 256K memory devices; however, the technique is usable only for breaking connections on the surface of a device and cannot be used to break connections below the surface without causing damage to the surrounding area.

SUMMARY OF THE INVENTION

Accordingly, it is an object of the present invention to overcome many disadvantages of the prior art systems.

It is another object of the present invention to provide a method for disconnecting electrical connections below the surface of a chip.

It is another object of the present invention to provide a method for disconnecting electrical circuits without generating contaminating by-products.

It is another object of the present invention to provide a technique for disconnecting electrical conductors without the use of laser ablation.

Thus, in accordance with a preferred embodiment of the invention, a gap is formed in a conductor leading to a device that may later have to be disconnected from the circuit. A thin layer of a metal such as silver, for example, 450 Angstroms thick is deposited in the gap interconnecting the two conductors and serves electrically to interconnect the conductors on either side of the gap. An insulating or dielectric film is deposited over the metal film to thereby form a composite metal-/insulating film. The insulating film has the property that it can absorb the thin metal film when the composite metal/insulating film is activated either photolytically or thermally, for example by focussed beam irradiation or by heating. When the metal film is absorbed into the insulating film, the electrical connection between the conductors is essentially broken. Thus, as long as the composite metal/insulating film is accessible to focussed beam irradiation or if the device can be heated in an oven, it will be possible to change it from a conductor connecting two conductors to an insulator, thus electrically disconnecting the two conductors without any ablative process. Furthermore, the process of disconnecting the two conductors can occur even though the conductors and the composite metal/insulating composite film are below the surface of a semiconductor chip, for example, when there is an oxide layer covering the films.

DESCRIPTION OF THE DRAWING

These and other objects and advantages of the present invention will become readily apparent upon consideration of the following detailed description and attached drawing wherein.

DETAILED DESCRIPTION OF THE PREFERRED EMBODIMENT

Figure 1:
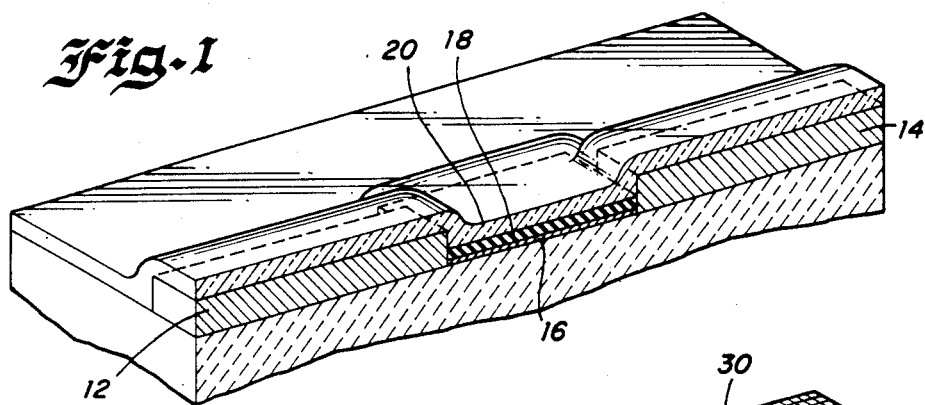
FIG. 1 is a perspective view showing a portion of a semiconductor device utilizing the disconnection technique according to the present invention.

Referring now to the drawing, whenever it is anticipated that it may be necessary subsequently to disconnect a device from the rest of the circuitry, the connection to the device is made by a pair of spaced conductors 12 and 14 having a space or gap therebetween. A thin metal film 16, for example, silver, silver alloy, copper or lead, is then deposited in the gap by conventional vacuum deposition methods. A layer or insulating material 18 having the capability of absorbing the metal film, i.e., silver, silver alloy, copper or lead, upon activation by irradiation or heating is deposited over the film 16 to thereby form a composite metal/insulating film. The insulating film 18 may be preferably a silver halide film, a lead halide film or a chalcogenide film such as, for example, $GeSe_2$ or $As_2S_3$. Either halide film can be used with any of the metals (silver, silver alloy, copper or lead). For the chalcogenide film, the preferred metal film is silver. Preferable halogens used in the silver or lead halide film include chlorine, bromine and iodine. An insulating layer 20 such as a layer of inorganic insulation such as silicon dioxide, silicon nitride or tantalum oxide, or an organic insulator such as polymethylmethacrylate (PMMA), polystrene or polyimide may be deposited over the layers 16 and 18. Under normal conditions without activation, the layer 16 will provide a low resistance electrical connection between the conductors 12 and 14, but if a laser is focussed onto the layer 18, or if the composite metal/insulating film is heated, for example, in an oven, the silver atoms from the layer 16 will be absorbed into the layer 18 thus disconnecting the conductors 12 and 14. The activation process is a photolytically or thermally induced diffusion process, rather than an ablation process, and may be performed even though the layer 18 is below the surface of the chip.

As stated above, the diffusion process can be induced either photolytically or thermally. In the photolytic process, the composite film need not be heated, and photon energy, for example, from a focussed laser source, is used to cause the diffusion process to occur. When the photolytic process is used, the intensity of the laser is not critical in the diffusion process because intensity only affects the rate at which the diffusion process occurs; however, the wavelength of the light energy is important. It has been found that a helium neon laser which emits red light is a good source, as is an argon laser which emits green light. A photolytic diffusion process suitable for use in conjunction with the present invention is described in U.S. Pat. No. 4,318,978.

A laser may also be used to induce the diffusion process thermally. In such a case, the laser is used to heat the composite film to cause the diffusion. When a laser is used for thermally inducing the diffusion process as opposed to photolytically inducing the diffusion process, the wavelength of the laser is not important. Rather, the intensity of the laser is important because enough energy to heat the composite film to a temperature on the order of 200° C. to 500° C. is required.

The thermal diffusion process may also be performed by heating the entire chip or multi-chip module, for example, in an oven that has been heated to, for example, about 250° C. The oven heating technique is particularly useful when large areas of the composite film are to be heated or if multiple disconnections are to be made simultaneously. These techniques may be employed for disconnecting devices on a single chip, or for disconnecting individual chips from other chips in a multi-chip package or module. Three examples of the application of this technique are listed below:

EXAMPLE 1

For example, if the device is used for disconnecting devices on a semiconductor chip, a film of silver, for example, typically 450 Angstroms may be deposited in the area between the conductors 12 and 14. On top of the silver film, a silver chloride film about 1500 Angstroms in thickness is provided.

If a particular device is found to be faulty, the layer 18 is exposed to a source of irradiation. For example, by using a helium-neon laser which emits light at 6328 Angstroms, it is possible photolytically to dissolve the silver film into the silver halide film. The He-Ne laser is focussed into a spot of approximately 5 microns in diameter. The surface power on the exposed area is about 3 milliwatts. The laser is scanned slowly across the area containing the silver and silver chloride films. As a result, the resistance of the connection between the conductors 10 and 12 is increased by at least six orders of magnitude, and for all practical purposes, the conductors are now electrically disconnected.

EXAMPLE 2

The same technique may be used to interconnect various semiconductor chips on a substrate. As in the case of a single chip, a break is provided in a conductor leading to the device which may later need to be disconnected. A thin layer of silver several hundred Angstroms thick is deposited in the gap between the conductors by standard thermal evaporation. Following the deposition of the silver film, a germanium-selenium alloy film consisting approximately of one part germanium and two parts selenium is deposited on the top of the silver film. The germanium-selenium film may be several thousand Angstroms thick and may be deposited by standard vacuum deposition techniques such as sputtering. The silver film serves to electrically connect the conductors on either side of the gap; however, when a focussed beam irradiates the area, or when the area is heated, for example, by the focussed beam or in an oven, the silver atoms will diffuse into the germanium-selenium film and the conductor will be effectively broken.

EXAMPLE 3

The present invention may also be used to extend the application of electroplating to discontinuous conductors. It is well known that electrical voltage is needed to drive the electroplating process. On the other hand, electroless plating is strictly a chemical process which does not require the application of an external voltage. Therefore, it is possible to deposit lines which are electrically disconnected from each other in any arrangement by the electroless plating process. On the other hand, lines deposited by electroplating must be electrically connected to each other in order for the process to occur. Electroplating offers very high speed deposition, very fine and well controlled dimensions and good electrical properties of the deposited metal films.

If it is desired to electroplate a discontinuous metal pattern utilizing the present invention, a plating base can be formed on a substrate by conventional vacuum deposition and photolithographic processes. In the region where the disconnection is to take place, the plating base is either not formed or subsequently removed. Instead, a composite film as described above and containing, for example, 50 Å of gold, 400 Å of silver and 2000 Å of silver chloride is deposited in this region. The region is then covered with an insulator such as silicon dioxide or polyamide. The substrate is then put into an electroplating bath and a metal film is deposited onto the plating base. After the required thickness is deposited, the substrate is taken out of the plating bath and dried. The substrate is then placed in an oven heated to approximately 250° C. for 60 minutes, to induce metal (Au/Ag) diffusion into the dielectric (AgCl) thereby electrically disconnecting the conductors that were previously electrically connected by the composite film. Alternatively, a laser can be used locally to irradiate the composite film lying beneath the polyamide film to thereby render the composite film electrically nonconducting. As a result, a section of the electroplated metal pattern will be completely electrically isolated from the rest of the pattern. By placing additional composite films at designated areas, any electrically disconnected metal pattern can be formed by electroplating.

Figure 2:
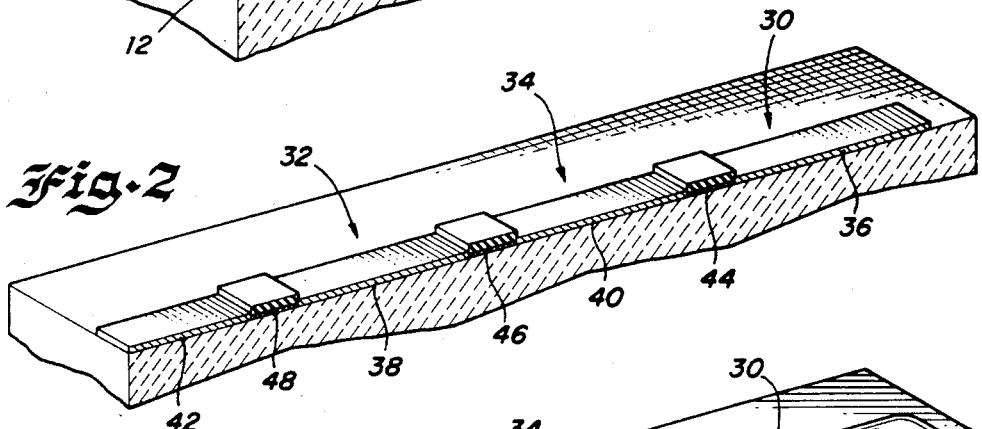
FIGS. 2-5 illustrate how the disconnection technique of the present invention may be used to permit electroplating of discontinuous conductors.
Figure 3:
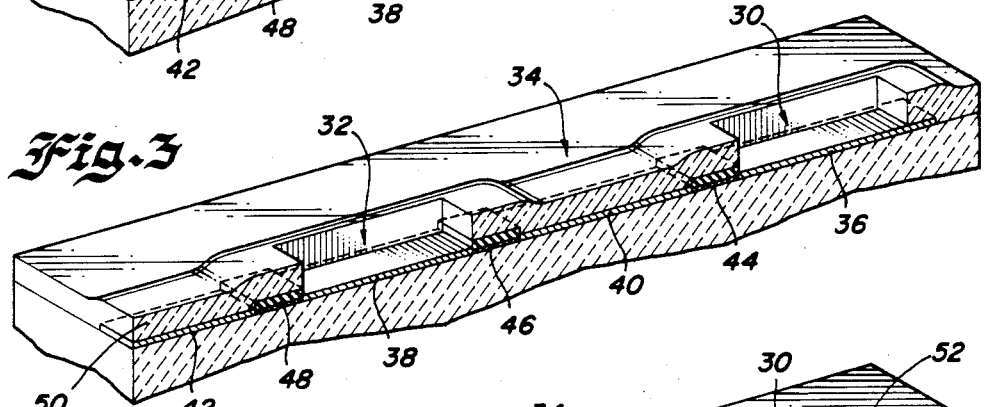
Figure 4:
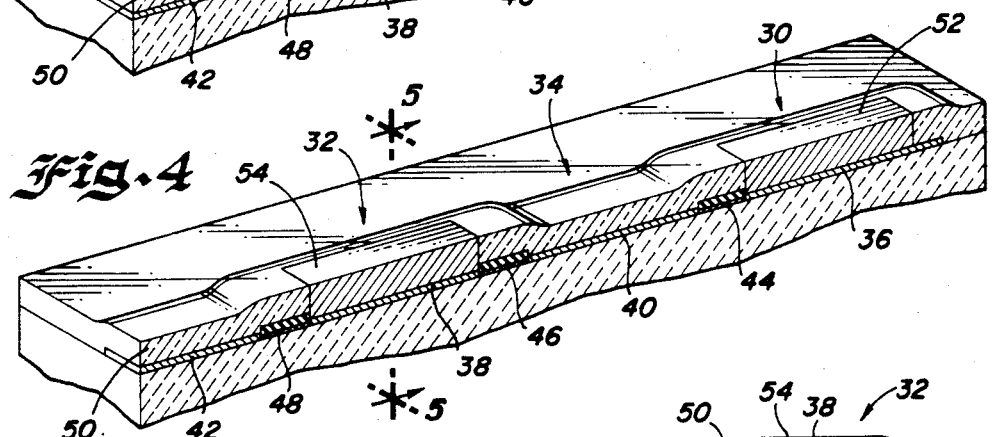

The use of the composite film according to the invention to permit electrically disconnected metal patterns to be formed by electroplating is illustrated in greater detail in FIGS. 2–4. Referring to FIG. 2, and assuming that it is desired to form an electroplated pattern consisting of two distinct areas generally designated by the reference numerals 30 and 32, that are separated by a gap generally designated by the reference numeral 34, a plating base 36 and 38 is deposited in the areas 30 and 32, respectively. The plating base may be deposited by conventional vacuum deposition techniques to a thickness of approximately 1000 Angstroms. The metal forming the plating base may include copper, chromium, gold or any metal or alloy that is compatible with the material being electroplated. In addition, additional areas of plating base 40 and 42, whose function shall be described in a subsequent portion of the specification, are interposed between the plating base 36 and 38 and adjacent to the plating base 38, respectively. The areas of plating base are separated from each other, and sections of composite film 44, 46 and 48 are deposited in the gaps between the different areas of plating base in order electrically to interconnect the areas of plating base.

Figure 5:
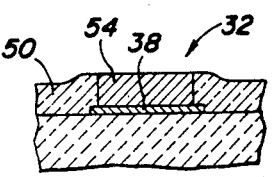

A dielectric film 50 (FIG. 3) which may be either an organic or inorganic dielectric film such as the film forming the previously described insulating layer 20 is then deposited over the structure illustrated in FIG. 2. Because it is desired to electroplate over the areas 30 and 32, the plating base 36 and 38 is not covered by the dielectric film 50. An electrical connection is then made to the plating base 42, preferably at the edge of the substrate, and the substrate is immersed in a plating solution. Electrical current is then passed from the plating base 42 through the composite film 48 through the plating base 38, through the composite film 46, plating base 40, composite film 44 and the plating base 36. Because only the areas 30 and 32 are exposed to the plating solution, plating occurs only over the plating bases 36 and 38. The plating process continues until the electroplating over the plating bases 36 and 38 reaches a desired thickness as is illustrated by the plated areas 52 and 54 (FIGS. 4 and 5). The substrate is then removed from the plating bath and the composite film areas 44, 46 and 48 are rendered nonconductive either photolytically or thermally as described above.

It is possible to use only a single area of composite film between the areas 30 and 32 to achieve the desired electroplating pattern. However, the use of two separate areas of composite film such as the areas 44 and 46 in combination with an area of plating base 40 to provide the disconnectable electrical connection between the plating areas 36 and 38 has the advantage that the use of two (or more) areas of composite film provides redundancy should one of the areas fail to disconnect. In addition, the electrical resistance of the plating base is lower than that of the composite film. Thus, the use of a combination of plating base and composite film areas in the space between the plated base areas 36 and 38 provides a lower resistance electrical connection than would be provided by the use of the composite film alone, particularly if the gap is long.

Obviously, many modifications and variations of the present invention are possible in light of the above teachings. Thus, it is to be understood that within the scope of the appended claims, the invention may be practiced otherwise than as specifically described above.

What is claimed and desired to be secured by Letters Patent of the United States is:

1. A method for electrically disconnecting conductors on a substrate comprising:
    depositing an electrically conductive film on the substrate that electrically interconnects the conductors to be subsequently electrically disconnected,
    depositing adjacent to the conductive film an insulating film to thereby form a composite film, said insulation film being capable of absorbing the conductive film when the composite film is activated, and
    inducing diffusion in the composite film to cause the insulating film to absorb the atoms of the conductive film to render the conductive film between the conductors nonconductive.

2. The method recited in claim 1 wherein said conductive film is a metal film.

3. The method recited in claim 2 wherein said conductive film is silver.

4. The method recited in claim 3 wherein said insulating film is a chalcogenide film.

5. The method recited in claim 4 wherein said chalcogenide film is formed from $GeSe_2$.

6. The method recited in claim 4 wherein said chalcogenide film is formed from $As_2S_3$.

7. The method recited in claim 3 wherein said insulating film is a silver halide film.

8. The method recited in claim 7 wherein said silver halide film is a silver chloride film.

9. The method recited in claim 7 wherein said silver halide film is a silver bromide film.

10. The method recited in claim 7 wherein said silver halide film is a silver iodide film.

11. The method recited in claim 2 wherein said conducting film is lead.

12. The method recited in claim 11 wherein said insulating film is a lead halide film.

13. The method recited in claim 12 wherein said lead halide film is a lead chloride film.

14. The method recited in claim 11 wherein said lead halide film is a lead bromide film.

15. The method recited in claim 11 wherein said lead halide film is a lead iodide film.

16. The method recited in claim 2 wherein said metal film is silver or lead or copper or a combination thereof.

17. The method recited in claim 16 wherein said insulating film is a silver or lead or copper halide film or a combination thereof.

18. The method recited in claim 1 wherein said substrate is a semiconductor chip.

19. The method recited in claim 1 wherein said composite film is locally heated by a focussed laser beam.

20. The method recited in claim 19 wherein said substrate has another layer disposed over the insulating film.

21. The method recited in claim 2 wherein said diffusion in said composite film is photolytically activated.

22. The method recited in claim 21 wherein said diffusion in said composite film is photolytically activated by focussed beam irradiation.

23. The method recited in claim 22 wherein said composite film is irradiated by a laser beam.

24. The method recited in claim 23 wherein said irradiating laser beam is a helium neon laser.

25. The method recited in claim 22 wherein said irradiating laser beam is an argon laser.

26. The method recited in claim 2 wherein said diffusion in said composite film is thermally activated.

27. The method recited in claim 26 wherein said diffusion in said composite film is thermally activated by heating the substrate in an oven.

28. The method recited in claim 26 wherein said composite film is thermally activated by localized heating.

29. The method recited in claim 28 wherein said localized heating is performed by focussed irradiation.

30. The method recited in claim 1 wherein said substrate contains thin film interconnecting conductor lines connecting a plurality of semiconductor chips to be selectively disconnected.

31. A substrate having a plurality of conductors disposed thereon and means for selectively electrically disconnecting predetermined ones of said conductors,
    said disconnecting means including a conductive metal film deposited on the substrate between the conductors to be disconnected and electrically connecting those conductors,
    an insulating film deposited over said metal film, said insulating film cooperating with said metal film to form a composite film, said composite film being responsive to the application of energy for absorbing the metal film into the insulating film to thereby disconnect the conductors.

32. The substrate recited in claim 31 wherein said metal film is a silver film.

33. The substrate recited in claim 32 wherein said silver film has a thickness of 150-1000 Angstroms.

34. The substrate recited in claim 32 wherein said insulating film is a chalcogenide film.

35. The substrate recited in claim 34 wherein said chalcogenide film is formed from $GeSe_2$.

36. The substrate recited in claim 34 wherein said chalcogenide film is formed from $As_2S_3$.

37. The substrate recited in claim 32 wherein said insulating film is a silver halide film.

38. The substrate recited in claim 37 wherein said silver halide film has a thickness of 300-5000 Angstroms.

39. The substrate recited in claim 37 wherein said silver halide film is a silver chloride film.

40. The substrate recited in claim 37 wherein said silver halide film is a silver bromide film.

41. The substrate recited in claim 37 wherein said silver halide film is a silver iodide film.

42. The substrate recited in claim 31 wherein said metal film is a lead film.

43. The substrate recited in claim 42 wherein said lead film has a thickness of 150-1000 Angstroms.

44. The substrate recited in claim 42 wherein said insulating film is a lead halide film.

45. The substrate recited in claim 44 wherein said lead halide film has a thickness of 300-5000 Angstroms.

46. The substrate recited in claim 44 wherein said silver halide film is a lead chloride film.

47. The substrate recited in claim 44 wherein said lead halide film is a lead bromide film.

48. The substrate recited in claim 44 wherein said lead halide film is a lead iodide film.

49. The substrate recited in claim 31 wherein said metal film is a silver, lead or copper film or a combination thereof.

50. The substrate recited in claim 49 wherein said insulating film is a silver, lead or copper halide film or a combination thereof.

51. The substrate recited in claim 50 wherein said substrate is a semiconductor chip.

52. The substrate recited in claim 51 wherein said composite film is responsive to a focussed laser beam to disconnect said conductors.

53. The substrate recited in claim 51 wherein said substrate contains thin film interconnecting conductor lines connecting a plurality of semiconductor chips to be selectively disconnected.

54. The substrate recited in claim 53 wherein said composite film is responsive to a focussed laser beam to disconnect said conductors.

55. The substrate recited in claim 54 wherein said substrate includes a plurality of layers, and wherein said metal film and said insulating film is disposed between layers.

56. The substrate recited in claim 55 wherein said composite film is responsive to a laser focussed thereon to disconnect said conductors below the surface of said substrate.

57. The substrate recited in claim 31 wherein said composite film is responsive to light energy.

58. The substrate recited in claim 31 wherein said composite film is responsive to light energy from a helium neon laser.

59. The substrate recited in claim 31 wherein said composite film is responsive to light energy from an argon laser.

60. The substrate recited in claim 31 wherein said composite film is responsive to heat energy.

61. The substrate recited in claim 60 wherein said composite film is responsive to heat energy in the temperature range of 250° to 500° C.

62. A method for electroplating an electrically discontinuous conductor line on a substrate comprising:
   forming a discontinuous plating base on the substrate;
   electrically interconnecting the discontinuous plating base with a thin metal film to electrically interconnect the discontinuous plating base;
   depositing an insulating film over the metal film interconnecting the plating base to form a composite metal/insulating film, said insulating layer being operative to absorb said metal film upon activation of said composite metal/insulating film;
   placing said substrate in an electroplating bath to thereby electroplate a metal onto predetermined portions of said plating base; and
   inducing diffusion in the composite metal/insulating film to disconnect the portions of the conductor line electrically connected by the metal film.

63. The method recited in claim 62 further including applying an insulating layer over said substrate, said insulating layer having formed therein apertures over the predetermined portions of said plating base to be electroplated.

* * * * *